United States Patent
Leigh et al.

(10) Patent No.: US 10,390,429 B2
(45) Date of Patent: Aug. 20, 2019

(54) PRINTED CIRCUIT BOARD FOR RECEIVING A SWITCH CHIP AND TRANSCEIVER MODULES

(71) Applicant: HEWLETT PACKARD ENTERPRISE DEVELOPMENT LP, Houston, TX (US)

(72) Inventors: Kevin B. Leigh, Houston, TX (US); John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/770,281

(22) PCT Filed: Oct. 23, 2015

(86) PCT No.: PCT/US2015/057076
§ 371 (c)(1),
(2) Date: Apr. 23, 2018

(87) PCT Pub. No.: WO2017/069771
PCT Pub. Date: Apr. 27, 2017

(65) Prior Publication Data
US 2018/0255638 A1    Sep. 6, 2018

(51) Int. Cl.
*H04B 10/40* (2013.01)
*H05K 1/11* (2006.01)
(Continued)

(52) U.S. Cl.
CPC .............. *H05K 1/11* (2013.01); *H04B 10/40* (2013.01); *H05K 1/0243* (2013.01);
(Continued)

(58) Field of Classification Search
CPC ........ H05K 1/11; H05K 1/0243; H05K 1/181; H05K 1/0295; H05K 1/41;
(Continued)

(56) References Cited

U.S. PATENT DOCUMENTS 6,532,156 B1    3/2003  Masui et al.
7,305,487 B2   12/2007  Blumrich et al.
(Continued)

FOREIGN PATENT DOCUMENTS

WO   WO 2013165344 A1 * 11/2013 ........... G02B 6/4284

OTHER PUBLICATIONS

International Search Report and Written Opinion, International Application No. PCT/US2015/057076, dated Jun. 30, 2016, pp. 1-8, KIPO.

(Continued)

*Primary Examiner* — Ted M Wang
(74) *Attorney, Agent, or Firm* — Dicke, Billig & Czaja, PLLC (57) ABSTRACT

One example of a system includes a printed circuit board. The printed circuit board includes a switch chip footprint to receive a higher lane count switch chip or a lower lane count switch chip. The printed circuit board includes a plurality of transceiver module footprints. Each transceiver module footprint is electrically coupled to the switch chip footprint. Each transceiver module footprint may receive a higher lane count transceiver module or a lower lane count transceiver module.

14 Claims, 6 Drawing Sheets

(51) Int. Cl.
*H05K 1/02* (2006.01)
*H05K 1/18* (2006.01)
*H05K 1/14* (2006.01)

(52) U.S. Cl.
CPC .......... *H05K 1/0295* (2013.01); *H05K 1/181* (2013.01); *H05K 1/141* (2013.01); *H05K 2201/09236* (2013.01); *H05K 2201/09272* (2013.01); *H05K 2201/09954* (2013.01); *H05K 2201/10121* (2013.01); *H05K 2201/10378* (2013.01)

(58) Field of Classification Search
CPC .......... H05K 2201/09954; H05K 2201/09236; H05K 2201/10121; H05K 2201/10378; H04B 10/40; H04B 10/801; H04B 10/1143; G02B 6/4246; G02B 6/4292
See application file for complete search history.

(56) References Cited

U.S. PATENT DOCUMENTS

| 8,208,480 | B2 | 6/2012 | Lund |
| 8,842,688 | B2 | 9/2014 | Vahdat et al. |
| 2002/0053728 | A1* | 5/2002 | Isaak .................. H01L 25/0657 257/686 |
| 2004/0150092 | A1 | 8/2004 | Morris |
| 2008/0007928 | A1 | 1/2008 | Salama et al. |
| 2008/0073111 | A1 | 3/2008 | Wolff |
| 2014/0013093 | A1 | 7/2014 | Alshinnawi et al. |
| 2014/0185121 | A1 | 7/2014 | Taraschi |

OTHER PUBLICATIONS

Mike Peng Li et al., "Transferring High-speed Data Over Long Distances with Combined FPGA and Multichannel Optical Modules," White Paper, Mar. 21, 2012, pp. 1-7, Avago Technologies.

* cited by examiner

PRINTED CIRCUIT BOARD FOR RECEIVING A SWITCH CHIP AND TRANSCEIVER MODULES

BACKGROUND

Transceiver modules, such as 1-lane Small Form-Factor Pluggable (SFP), 4-lane Quad Small Form-Factor Pluggable (QSFP), and 12-lane CXP, are used for network data communications. The transceiver modules are hot-pluggable to a system board, such as a printed circuit board of a switch module. A system board is typically behind a faceplate where connectors for coupling communication cables (e.g., fiber optic cables) to the transceiver modules are arranged.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Pluggable cages for receiving transceiver modules may use large electrical connectors to support high lane-count optical transceivers and multiple printed circuit boards (PCBs) may be used (e.g., one PCB for transmitter components and another PCB for receiver components). The pluggable cages may also take up a significant amount of space, may not efficiently support high-speed signals, may not efficiently support cooling, and may not be cost efficient due to large electro-mechanical overheads and relatively small lane count. Line cards may be used to support high lane-count transceivers (or multiple pluggable cages) but they may use even larger PCBs than pluggable cages, may be even more difficult to cool due to the use of mid-planes, and may be more expensive than pluggable cages. When pluggable transceiver modules operate in hot thermal environments, the modules may have a shorter wear-out failure lifetime, which in turn necessitates that the modules be replaceable. If the wear-out reliability of optical transceivers can be improved (e.g., by allowing the transceivers to operate in a cooler temperature environment), many applications may not require the replacement of transceivers once they are installed in a system.

High-radix switch chip technology advancements have enabled switch chips having an increasing number of lanes (e.g., greater than 128) at data rates of 25 Gbps/lane or higher while not significantly increasing power consumption. A 1 U switch box may support these high-radix switch chips, but a 1 U faceplate does not have enough space to accommodate the needed number of standard form factor transceiver modules. In addition, various switch chips may be available with varying numbers of lanes for different applications. To use these various switch chips, multiple unique PCBs need to be designed for the variations in switch chips, thereby contributing to higher development costs.

In addition, in one switch module example, all transceiver modules may be low lane count type modules (e.g., QSFP) where different number ratios of transceiver modules can be used for uplink ports versus downlink ports. The uplink ports enable the switch module to connect to other switches, while the downlink ports enable the switch module to connect to server systems. In other examples, for a switch to use high lane count transceiver modules, a switch board may be uniquely designed for mid-board optics transceiver modules for downlink ports and QSFP transceiver modules for uplink ports. When different ratios of high lane count mid-board optics transceiver modules for downlink ports and low lane count QSFP transceiver modules for uplink ports are needed, a different switch module PCB needs to be designed.

Accordingly, this disclosure describes a modularly configurable switch module including a PCB including a switch chip footprint that may receive a higher lane count switch chip or a lower lane count switch chip. The PCB also includes a plurality of transceiver module footprints. Each transceiver module footprint is electrically coupled to the switch chip footprint. Each transceiver module footprint may receive a higher lane count transceiver module or a lower lane count transceiver module. A transceiver module may be installed on each transceiver module footprint corresponding to the switch chip installed on the switch chip footprint. Therefore, by using a single PCB design, a switch module may be assembled to support a desired number of lanes and a plurality of transceiver modules having different configurations.

The transceiver modules may not use hot-blindmate mechanics, and thus are cost and space efficient. In addition, the transceiver modules may be built more reliably with no or fewer moving parts that are typically used for hot-blindmate mechanics. The transceiver modules may include a PCB to support transceiver devices on the top side and contacts on the bottom side to electrically couple to a transceiver module footprint. The transceiver modules may include a faceplate having one or multiple faceplate connectors to electrically and/or optically couple to transceiver devices. The transceiver modules may include alignment and retention mechanisms to secure to the system.

Figure 1:
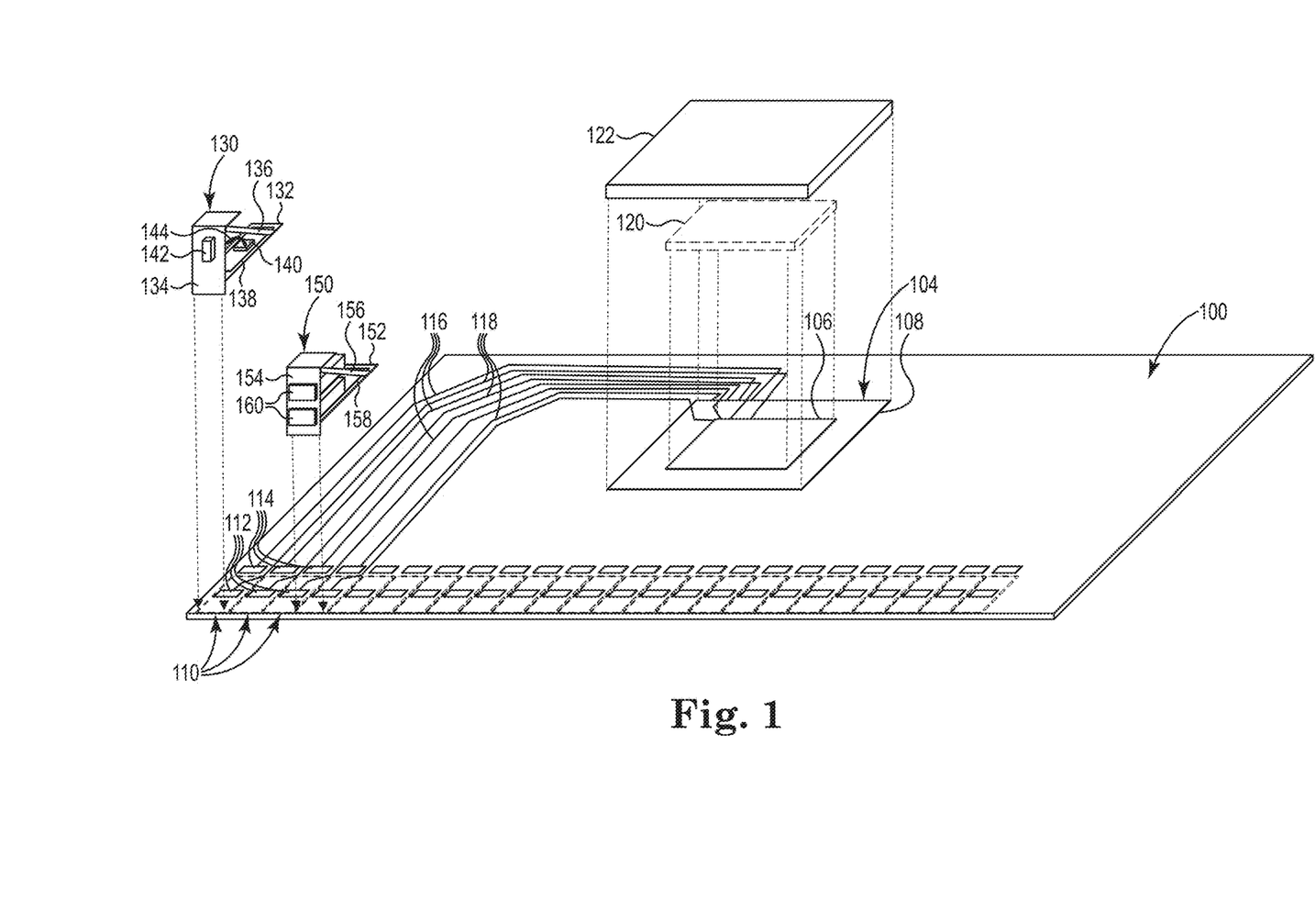
FIG. 1 illustrates one example of a printed circuit board for receiving a switch chip and transceiver modules.

FIG. 1 illustrates one example of a PCB 100 for receiving a switch chip and transceiver modules. PCB 100 may provide a system board of a switch module. PCB 100 includes a switch chip footprint 104 and a plurality of transceiver module footprints 110. Switch chip footprint 104 includes a first zone 106 and a second zone 108. First zone 106 is a sub-set of second zone 108. First zone 106 includes first contacts and second zone 108 includes second contacts. In this example, switch chip footprint 104 may be electrically coupled to either a first switch chip 120 or a second switch chip 122. First switch chip 120 has a first number of contacts and second switch chip 122 has a second number of contacts greater than the first number. First switch chip 120 is a lower lane count switch chip, and second switch chip 122 is higher lane count switch chip. The contacts of first switch chip 120 may be electrically coupled to the contacts of first zone 106, or the contacts of second switch chip 122 may be electrically coupled to the contacts of first zone 106 and second zone 108. First switch chip 120 does not include contacts to electrically couple to the contacts of second zone 108.

In the example illustrated in FIG. 1, first switch chip 120 has a smaller length and width in the direction parallel to PCB 100 than second switch chip 122. In other examples, however, first switch chip 120 may have the same length and width in the direction parallel to PCB 100 as second switch chip 122.

Also as illustrated in FIG. 1, first zone 106 and second zone 108 are concentric zones. In other examples, however, first zone 106 and second zone 108 may be interleaved. In any case, first switch chip 120 includes contacts to electrically couple to only the contacts of first zone 106, and second switch chip 122 includes contacts to electrically couple to the contacts of first zone 106 and second zone 108.

In this example, PCB 100 includes 24 transceiver module footprints 110. In other examples, PCB 100 may include another suitable number of transceiver module footprints 110 (e.g., 8, 12, or 16 module footprints). Each transceiver module footprint 110 includes a third zone 112 and a fourth zone 114. While third zone 112 and fourth zone 114 are illustrated in FIG. 1 as spaced apart zones, in other examples third zone 112 and fourth zone 114 may be directly adjacent to each other or interleaved. Third zone 112 and fourth zone 114 may also be arranged at any suitable location within each transceiver module footprint 110. Each third zone 112 includes third contacts and each fourth zone 114 includes fourth contacts.

In this example, each transceiver module footprint 110 may be electrically coupled to either a first transceiver module (e.g., transceiver module 150) or a second transceiver module (e.g., transceiver module 130). First transceiver module 150 has a third number of contacts and second transceiver module 130 has a fourth number of contacts greater than the third number. First transceiver module 150 is a lower lane count transceiver module, and second transceiver module 130 is a higher lane count transceiver module. The contacts of first transceiver module 150 may be electrically coupled to the contacts of the third zone 112 of a module footprint 110. First transceiver module 150 does not include contacts to electrically couple to the contacts of a fourth zone 114. The contacts of second transceiver module 130 may be electrically coupled to the contacts of the third zone 112 and the contacts of the fourth zone 114 of a module footprint 110. Each of the contacts of each third zone 112 is electrically coupled to a contact of first zone 106 through electrical traces 116 (only partially illustrated for simplicity) of PCB 100. Each of the contacts of each fourth zone 114 is electrically coupled to a contact of second zone 108 through electrical traces 118 (only partially illustrated for simplicity) of PCB 100.

Transceiver module 130 includes a module board support structure 132, a faceplate 134, brackets 136, and a module board 138 (e.g., a PCB). Brackets 136 provide structural support for module board support structure 132 and faceplate 134. Module board 138 is attached to module board support structure 132 and is perpendicular to faceplate 134. In the example illustrated in FIG. 1, an optical transceiver 140 (e.g., a mid-board optical transceiver chip) is electrically coupled to module board 138. An optical connector 142 is coupled to faceplate 134. An optical cable 144 optically couples optical transceiver 140 to optical connector 142. Optical connector 142 may be a MPO type connector and optical cable 144 may include 12 fibers. In other examples, transceiver module 130 may include other configurations, such as pluggable transceiver cages. In addition, a signal retime chip (not shown) and/or a management controller chip (not shown) may be electrically coupled to module board 138. The signal retime chip is to condition electrical signals of transceiver module 130. The management controller chip is electrically coupled to optical transceivers or pluggable transceiver cages through module board 138 to aggregate management signals for multiple transceivers of transceiver module 130.

Transceiver module 130 may be used with switch chip 122. With transceiver module 130 installed on PCB 100, module board 138 contacts a transceiver module footprint 110. Module board 138 may be aligned with a transceiver module footprint 110 via transceiver module alignment mechanisms (not shown) and secured to PCB 100 via transceiver module retention mechanisms (not shown). In one example, transceiver module 130 may be electrically coupled to the contacts of the third zone 112 and the fourth zone 114 of a transceiver module footprint 110 via an array of parallel-plane-mating contacts on the bottom surface of module board 138.

Transceiver module 150 includes a module board support structure 152, a faceplate 154, brackets 156, a module board 158, and dual QSFP transceiver cages 160. Brackets 156 provide structural support for module board support structure 152 and faceplate 154. Module board 158 is attached to module board support structure 152 and is perpendicular to faceplate 154. Faceplate 154 includes openings to each transceiver cage of dual QSFP transceiver cages 160. Dual QSFP transceiver cages 160 are electrically coupled to module board 158. In other examples, transceiver module 150 may include other configurations, such as μQSFP transceiver cages.

Transceiver module 150 may be used with switch chip 120. With transceiver module 150 installed on PCB 100, module board 158 contacts a transceiver module footprint 110. Module board 158 may be aligned with a transceiver module footprint 110 via transceiver module alignment mechanisms (not shown) and secured to PCB 100 via transceiver module retention mechanisms (not shown). In one example, transceiver module 150 may be electrically coupled to the contacts of the third zone 112 of a transceiver module footprint 110 via an array of parallel-plane-mating contacts on the bottom surface of module board 158.

Figure 2:
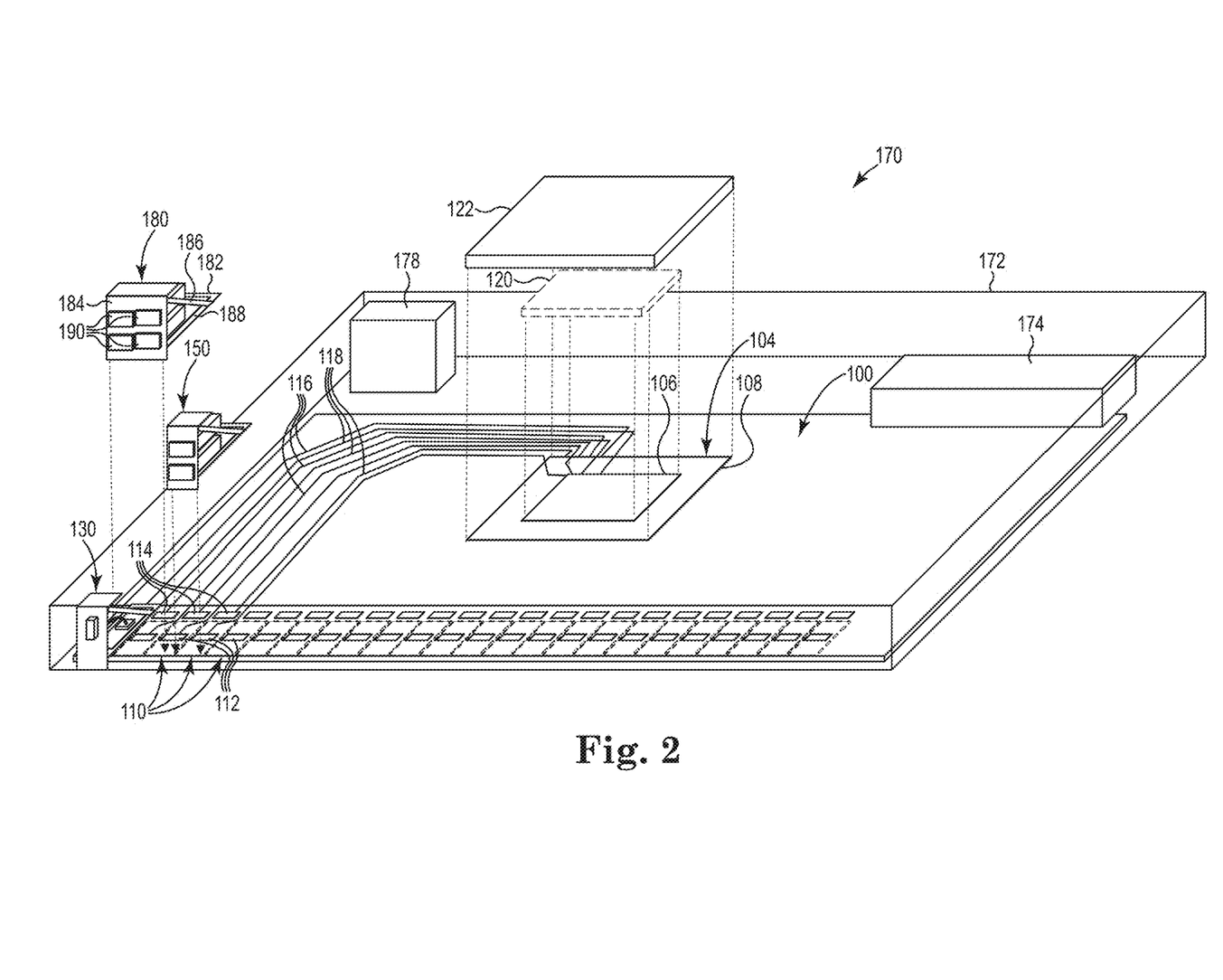
FIG. 2 illustrates one example of a switch module.

FIG. 2 illustrates one example of a switch module 170. Switch module 170 includes PCB 100 previously described and illustrated with reference to FIG. 1. In addition, switch module 170 includes a housing 172, a power supply 174, and fans 178. Power supply 174 is electrically coupled to PCB 110 and provides power to PCB 110 from a system in which switch module 170 is installed. Fan 178 may be electrically coupled to power supply 174 or PCB 100 and circulates air through housing 172 to cool the components inside housing 172, including the installed switch chip and transceiver modules.

Housing 172 is a 1 U housing such that transceiver modules (e.g., transceiver modules 130, 150, and 180) having faceplates sized to fit a 1 U housing may be installed in switch module 170. Transceiver module 130, other lower lane count transceiver modules, and a lower lane count switch chip 120 may be installed in switch module 170. Alternatively, transceiver module 150, other higher lane count transceiver modules, and a higher lane count switch chip 122 may be installed in switch module 170. Accordingly, switch module 170 is modularly configurable to support a higher lane count or a lower lane count based on the switch chip and corresponding transceiver modules installed in switch module 170.

PCB 100 of switch module 170 may also receive a transceiver module 180. Transceiver module 180 may include twice the number of lanes as a lower lane count transceiver module, such as transceiver module 130, or twice the number of lanes as a higher lane count transceiver module, such as transceiver module 150. In this example, transceiver module 180 includes a module board support structure 182, a faceplate 184, brackets 186, a module board 188, and four QSFP transceiver cages 190. Brackets 186 provide structural support for module board support structure 182 and faceplate 184. Faceplate 184 is twice as wide as the faceplates of transceiver modules 130 and 150. Module board 188 is attached to module board support structure 182 and is perpendicular to faceplate 184. Faceplate 184 includes openings to each of the four QSFP transceiver cages 190. QSFP transceiver cages 190 are electrically coupled to module board 188. In other examples, transceiver module 180 may include other configurations, such as μQSFP transceiver cages or mid-board optics transceivers.

Transceiver module 180 may be used with switch chip 120 or 122, depending on the number of lanes supported by transceiver module 180. With transceiver module 180 installed on PCB 100, module board 188 contacts two transceiver module footprints 110. Module board 188 may be aligned with two transceiver module footprints 110 via transceiver module alignment mechanisms (not shown) and secured to PCB 100 via transceiver module retention mechanisms (not shown). In one example, transceiver module 180 may be electrically coupled to the contacts of the third zone 112 of two transceiver module footprints 110 via an array of parallel-plane-mating contacts on the bottom surface of module board 188. In another example, transceiver module 180 may be electrically coupled to the contacts of the third zone 112 and the fourth zone 114 of two transceiver module footprints 110 via an array of parallel-plane-mating contacts on the bottom surface of module board 188.

Figure 3:
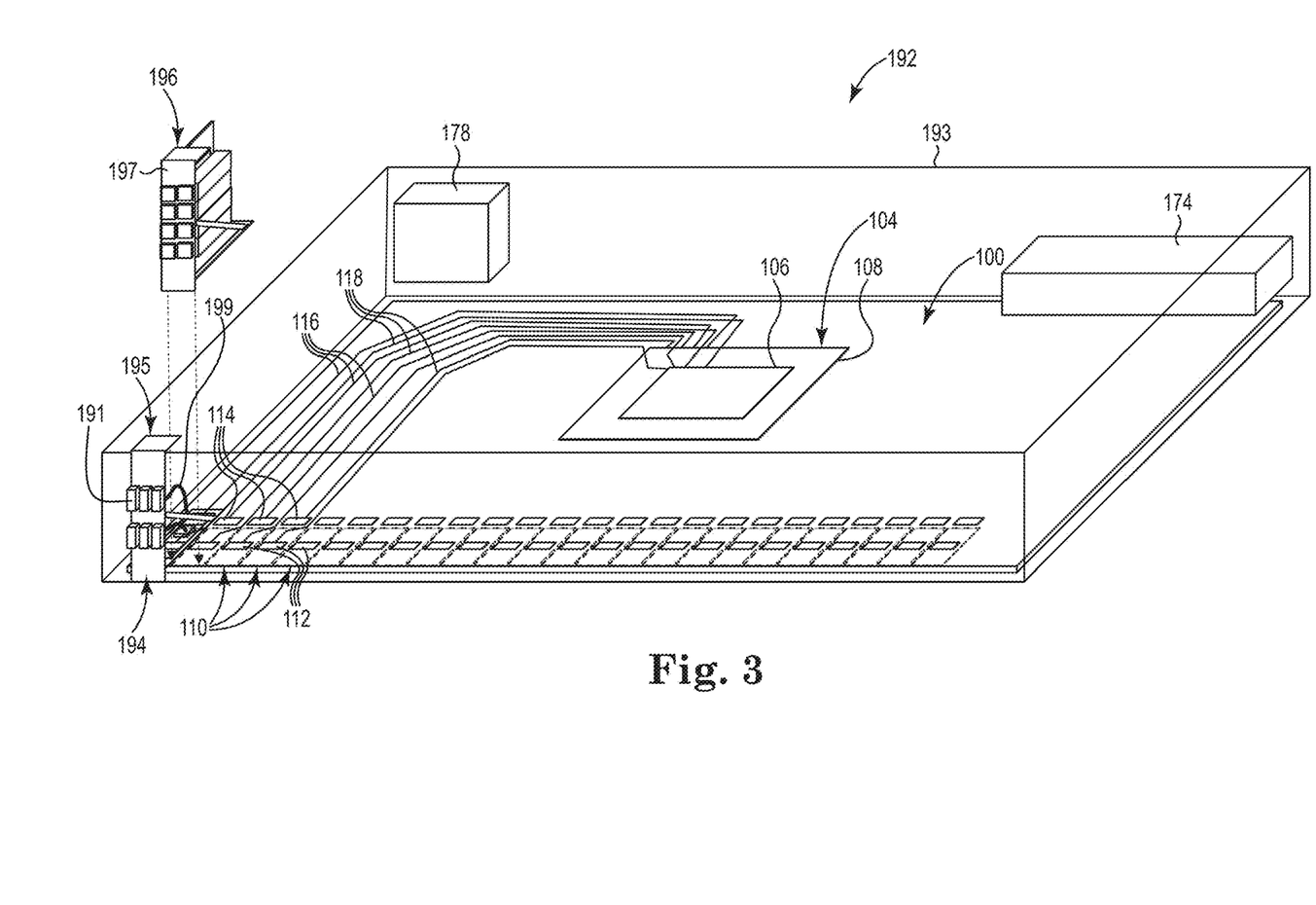
FIG. 3 illustrates another example of a switch module.

FIG. 3 illustrates another example of a switch module 192. Switch module 192 includes PCB 100 previously described and illustrated with reference to FIG. 1 and power supply 174 and fans 178 previously described and illustrated with reference to FIG. 2. In another example, switch module 192 may use a different power supply and/or fans. In addition, switch module 192 includes a housing 193. Housing 193 is a 2 U housing such that transceiver modules (e.g., transceiver modules 194 and 196) having faceplates sized to fit a 2 U housing may be installed in switch module 192. In other examples, housing 193 may be a 3 U housing or another suitable housing for receiving transceiver modules having faceplates sized to fit the housing.

In this example, transceiver module 194 has a faceplate 195 and transceiver module 196 has a faceplate 197 sized to fit 2 U housing 193. Transceiver module 194 is an example of a transceiver module including mid-board optics optically coupled to optical connectors 191 on faceplate 195 via optical cables 199. In this example, transceiver module 194 includes six optical connectors 191, where optical connectors 191 may be LC Duplex type connectors and optical cables 199 may include 12 fibers. Transceiver module 194 may have the same transceiver module board as transceiver module 130 illustrated in FIG. 1, where both transceiver modules 194 and 130 support 12-lane optical signals. Transceiver module 130 in FIG. 1 may use a 12-fiber MPO optical connector, and the faceplate 134 fits in a 1 U switch module 172 (shown in FIG. 2). Optical connector 142 in FIG. 1 allows a connection to another system (not shown). Transceiver module 194, based on the same transceiver module board as transceiver module 130, may use six 2-fiber LC Duplex connectors 191, and the faceplate 197 fits in a 2 U switch module 193. Optical connectors 191 allow connections to six systems (not shown).

Transceiver module 196 is an example of a transceiver module including pluggable transceiver cages. Transceiver modules 194 and 196 may have other configurations. Transceiver modules 194 and/or 196 may be used with a switch chip electrically coupled to first zone 106 or a switch chip electrically coupled to first zone 106 and second zone 108, depending on the number of lanes supported by each transceiver module 194 and 196.

PCB 100 in switch module 192 may include 24 transceiver module footprints 110. Transceiver modules 194 may be installed on a number of footprints 110, and transceiver modules 196 may be installed on the remaining number of footprints 110. Transceiver modules 194 may be used to connect to server systems (not shown), and thus transceiver modules 194 may be referred to as downlink modules. Transceiver modules 196 may be used to connect to other switch modules (not shown), and thus transceiver modules 196 may be referred to as uplink modules. The number ratio of transceiver modules 194 to transceiver modules 196 can be referred to as the downlink-to-uplink ratio, which can be used to calculate the bandwidth over-subscription ratio of switch module 192. Since footprints 110 may be used for either transceiver modules 194 or 196, different numbers of transceiver modules 194 and 196 may be installed in switch module 192. Therefore, switch module 192 with the same PCB 100 can be configured to have a specific bandwidth over-subscription ratio by installing the appropriate numbers of transceiver modules 194 and 196.

Figure 4:
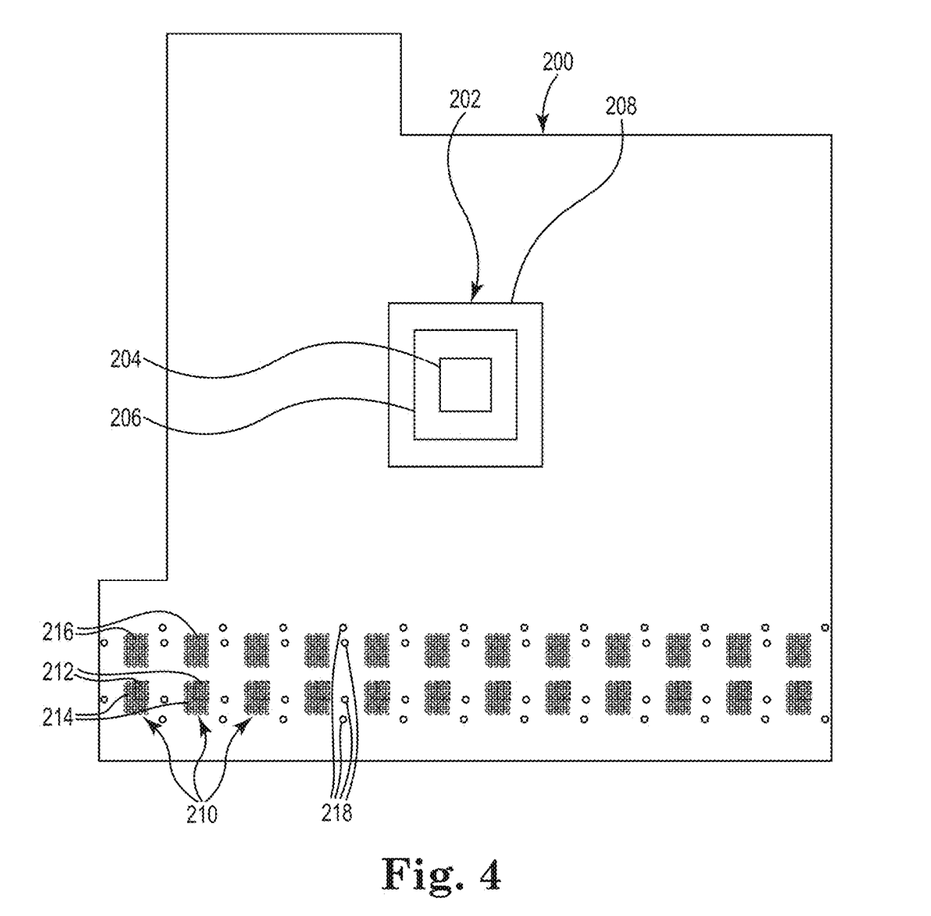
FIG. 4 illustrates another example of a printed circuit board for receiving a switch chip and transceiver modules.

FIG. 4 illustrates another example of a PCB 200 for receiving a switch chip and transceiver modules. PCB 200 may provide a system board of a switch module. PCB 200 includes a switch chip footprint 202 and a plurality of transceiver module footprints 210. Switch chip footprint 202 includes a first zone 204, a second zone 206, and a third zone 208. First zone 204 includes first contacts, second zone 206 includes second contacts, and third zone 208 includes third contacts.

In this example, switch chip footprint 202 may be electrically coupled to either a first switch chip, a second switch chip, or a third switch chip (not shown). The first switch chip has a first number of contacts, the second switch chip has a second number of contacts greater than the first number, and the third switch chip has a third number of contacts greater than the second number. The first switch chip is a lower lane count switch chip, the second switch chip is higher lane count switch chip than the first switch chip, and the third switch chip is a higher lane count switch chip than the second switch chip.

The contacts of the first switch chip may be electrically coupled to the contacts of first zone 204. The first switch chip does not include contacts to electrically couple to the contacts of second zone 206 or third zone 208. The contacts of the second switch chip may be electrically coupled to the contacts of first zone 204 and second zone 206. The second switch chip does not include contacts to electrically couple to the contacts of third zone 208. The contacts of the third switch chip may be electrically coupled to the contacts of first zone 204, second zone 206, and third zone 208.

While first zone 204, second zone 206, and third zone 208 are illustrated in FIG. 4 as concentric zones, in other examples first zone 204, second zone 206, and third zone 208 may be interleaved. In any case, the first switch chip includes contacts to electrically couple to only the contacts of first zone 204, the second switch chip includes contacts to electrically couple to only the contacts of first zone 204 and second zone 206, and the third switch chip includes contacts to electrically couple to the contacts of first zone 204, second zone 206, and third zone 208.

In this example, PCB 200 includes 12 transceiver module footprints 210. In other examples, PCB 200 may include another suitable number of transceiver module footprints 210 (e.g., 8, 16, or 24 module footprints). Each transceiver module footprint may include alignment and/or retention mechanisms 218. In one example, alignment and/or retention mechanisms 218 include holes through PCB 200 for receiving alignment pins and/or fasteners of transceiver modules. In addition, each transceiver module footprint 210 includes a fourth zone 212, a fifth zone 214, and a sixth zone 216. While fourth zone 212 and fifth zone 214 are grouped together and spaced apart from sixth zone 216 as illustrated in FIG. 4, in other examples fourth zone 212, fifth zone 214, and sixth zone 216 may be arranged at any suitable location within each transceiver module footprint 210. Each fourth zone 212 includes fourth contacts, each fifth zone 214 includes fifth contacts, and each sixth zone 216 includes sixth contacts.

In this example, each transceiver module footprint 210 may be electrically coupled to either a first transceiver module, a second transceiver module, or a third transceiver module (not shown). The first transceiver module has a fourth number of contacts, the second transceiver module has a fifth number of contacts greater than the fourth number, and the third transceiver module has a sixth number of contacts greater than the fifth number. The first transceiver module is a lower lane count transceiver module, the second transceiver module is a higher lane count transceiver module than the first transceiver module, and the third transceiver module is a higher lane count transceiver module than the second transceiver module.

The contacts of the first transceiver module may be electrically coupled to the contacts of the fourth zone 212 of a module footprint 210. The first transceiver module does not include contacts to electrically couple to the contacts of a fifth zone 214 or a sixth zone 216 of a module footprint 210. The contacts of the second transceiver module may be electrically coupled to the contacts of the fourth zone 212 and the fifth zone 214 of a module footprint 210. The second transceiver module does not include contacts to electrically couple to the contacts of a sixth zone 216 of a module footprint 210. The contacts of the third transceiver module may be electrically coupled to the contacts of the fourth zone 212, the fifth zone 214, and the sixth zone 216 of a module footprint 210.

Each of the contacts of the fourth zone 212 of each module footprint 210 is electrically coupled to a contact of first zone 202 of switch chip footprint 202 through an electrical trace (not shown) of PCB 200. Each of the contacts of the fifth zone 214 of each module footprint 210 is electrically coupled to a contact of second zone 206 of switch chip footprint 202 through an electrical trace (not shown) of PCB 200. Each of the contacts of the sixth zone 216 of each module footprint 210 is electrically coupled to a contact of third zone 208 of switch chip footprint 202 through an electrical trace (not shown) of PCB 200.

Figure 5A:
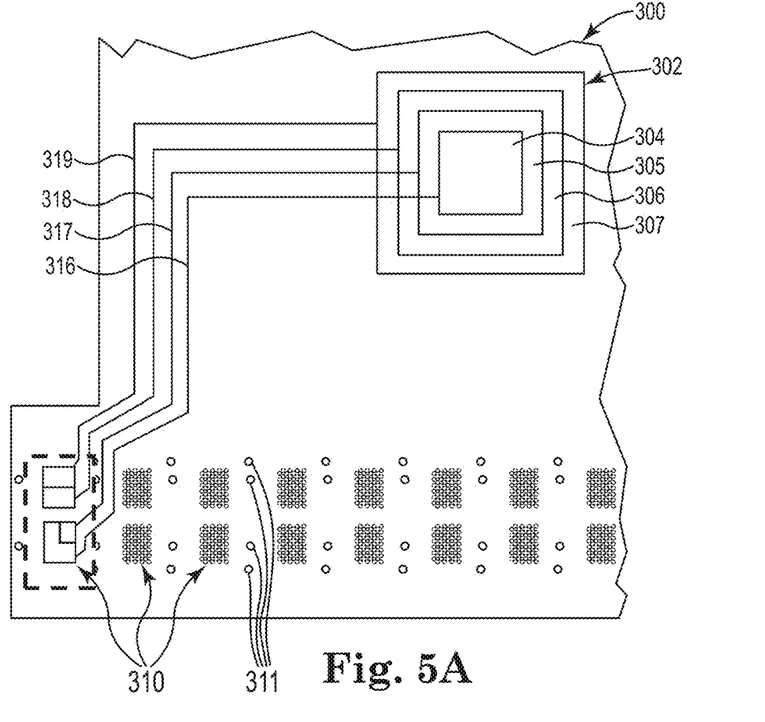
FIGS. 5A and 5B illustrate portions of another example of a printed circuit board for receiving a switch chip and transceiver modules.
Figure 5B:
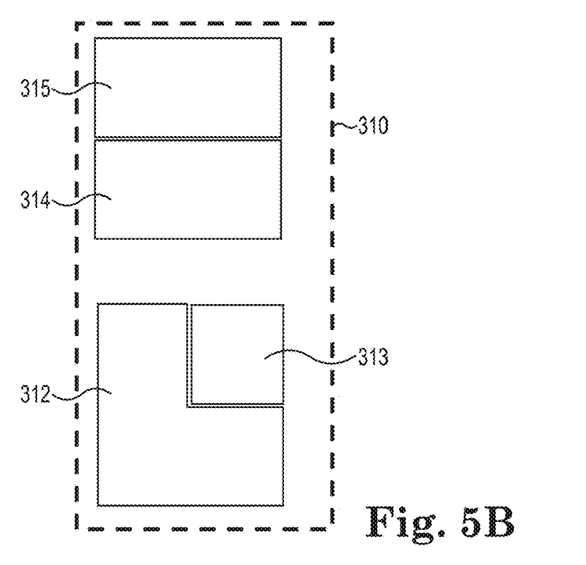

FIG. 5A illustrates a portion of a PCB 300 for receiving a switch chip and transceiver modules, and FIG. 5B illustrates an enlarged view of a transceiver module footprint 310 of PCB 300. PCB 300 may provide a system board of a switch module. PCB 300 includes a switch chip footprint 302 and a plurality of transceiver module footprints 310. Switch chip footprint 302 includes a first zone 304, a second zone 305, a third zone 306, and a fourth zone 307. First zone 304 includes first contacts, second zone 305 includes second contacts, third zone 306 includes third contacts, and fourth zone 307 includes fourth contacts. In one example, first zone 304 supports 12-lanes for each transceiver module footprint 310, second zone 306 supports 4-lanes for each transceiver module footprint 310, third zone 306 supports 8-lanes for each transceiver module footprint 310, and fourth zone 307 supports 8-lanes for each transceiver module footprint 310.

In this example, switch chip footprint 302 may be electrically coupled to either a first switch chip, a second switch chip, a third switch chip, or a fourth switch chip (not shown). The first switch chip has a first number of contacts, the second switch chip has a second number of contacts greater than the first number, the third switch chip has a third number of contacts greater than the second number, and the fourth switch chip has a fourth number of contacts greater than the third number. The first switch chip is a lower lane count switch chip corresponding to first zone 304. The second switch chip is a higher lane count switch chip than the first switch chip and corresponds to first zone 304 and second zone 305. The third switch chip is a higher lane count switch chip than the second switch chip and corresponds to first zone 304, second zone 305, and third zone 306. The fourth switch chip is a higher lane count switch chip than the third switch chip and corresponds to first zone 304, second zone 305, third zone 306, and fourth zone 307.

The contacts of the first switch chip may be electrically coupled to the contacts of first zone 304. The first switch chip does not include contacts to electrically couple to the contacts of second zone 305, third zone 306, or fourth zone 307. The contacts of the second switch chip may be electrically coupled to the contacts of first zone 304 and second zone 305. The second switch chip does not include contacts to electrically couple to the contacts of third zone 306 and fourth zone 307. The contacts of the third switch chip may be electrically coupled to the contacts of first zone 304, second zone 305, and third zone 306. The third switch chip does not include contacts to electrically couple to the contacts of fourth zone 307. The contacts of the fourth switch chip may be electrically coupled to the contacts of first zone 304, second zone 305, third zone 306, and fourth zone 307.

While first zone 304, second zone 305, third zone 306, and fourth zone 307 are illustrated in FIG. 5A as concentric zones, in other examples first zone 304, second zone 305, third zone 306, and fourth zone 307 may be interleaved. In any case, the first switch chip includes contacts to electrically couple to only the contacts of first zone 304. The second switch chip includes contacts to electrically couple to only the contacts of first zone 304 and second zone 305. The third switch chip includes contacts to electrically couple to only the contacts of first zone 304, second zone 305, and third zone 306. Finally, the fourth switch chip includes contacts to electrically couple to the contacts of first zone 304, second zone 305, third zone 306, and fourth zone 307. In one example first zone 304 supports up to 96-lanes, second zone 305 supports up to 32-lanes, third zone 306 supports up to 64-lanes, and fourth zone 307 supports up to 64-lanes.

PCB 300 may include any suitable number of transceiver module footprints 310 (e.g., 8, 12, 16, or 24 module footprints). Each transceiver module footprint may include alignment and/or retention mechanisms 311. In one example, alignment and/or retention mechanisms 311 include holes through PCB 300 for receiving alignment pins and/or fasteners of transceiver modules. In addition, each transceiver module footprint 310 includes a fifth zone 312, a sixth zone 313, a seventh zone 314, and an eighth zone 315. While grouped together fifth zone 312 and sixth zone 313 are spaced apart from grouped together seventh zone 314 and eighth zone 315 as illustrated in FIG. 5B, in other examples fifth zone 312, sixth zone 313, seventh zone 314, and eighth zone 315 may be arranged at any suitable location within each transceiver module footprint 310. Each fifth zone 312 includes fifth contacts, each sixth zone 313 includes sixth contacts, each seventh zone 314 includes seventh contacts, and each eighth zone 315 includes eighth contacts. In one example, each fifth zone 312 supports 12-lanes, each sixth zone 313 supports 4-lanes, each seventh zone 314 supports 8-lanes, and each eighth zone 315 supports 8-lanes.

In this example, each transceiver module footprint 310 may be electrically coupled to either a first transceiver module, a second transceiver module, a third transceiver module, or a fourth transceiver module (not shown). The first transceiver module has a fifth number of contacts. The second transceiver module has a sixth number of contacts greater than the fifth number. The third transceiver module has a seventh number of contacts greater than the sixth number, and the fourth transceiver module has an eighth number of contacts greater than the seventh number. The first transceiver module is a lower lane count transceiver module corresponding to fifth zone 312. The second transceiver module is a higher lane count transceiver module than the first transceiver module and corresponds to fifth zone 312 and sixth zone 313. The third transceiver module is a higher lane count transceiver module than the second transceiver module and corresponds to fifth zone 312, sixth zone 313, and seventh zone 314. The fourth transceiver module is a higher lane count transceiver module than the third transceiver module and corresponds to fifth zone 312, sixth zone 313, seventh zone 314, and eighth zone 315.

The contacts of the first transceiver module may be electrically coupled to the contacts of the fifth zone 312 of a module footprint 310. The first transceiver module does not include contacts to electrically couple to the contacts of a sixth zone 313, a seventh zone 314, or an eighth zone 315 of a module footprint 310. The contacts of the second transceiver module may be electrically coupled to the contacts of the fifth zone 312 and the sixth zone 313 of a module footprint 310. The second transceiver module does not include contacts to electrically couple to the contacts of a seventh zone 314 or an eighth zone 315 of a module footprint 310. The contacts of the third transceiver module may be electrically coupled to the contacts of the fifth zone 312, sixth zone 313, and seventh zone 314 of a module footprint 310. The third transceiver module does not include contacts to electrically couple to the contacts of an eighth zone 315 of a module footprint 310. The contacts of the fourth transceiver module may be electrically coupled to the contacts of the fifth zone 312, the sixth zone 313, the seventh zone 314, and the eighth zone 315 of a module footprint 310.

The contacts of fifth zone 312 of each module footprint 310 are electrically coupled to the contacts of first zone 304 of switch chip footprint 302 through electrical traces 316 (only illustrated for one module footprint 310 for simplicity) of PCB 300. The contacts of sixth zone 313 of each module footprint 310 are electrically coupled to the contacts of second zone 305 of switch chip footprint 302 through electrical traces 317 of PCB 300. The contacts of seventh zone 314 of each module footprint 310 are electrically coupled to the contacts of third zone 306 of switch chip footprint 302 through electrical traces 318 of PCB 300. The contacts of eighth zone 315 of each module footprint 310 are electrically coupled to the contacts of fourth zone 307 of switch chip footprint 302 through electrical traces 319 of PCB 300.

Figure 6A:
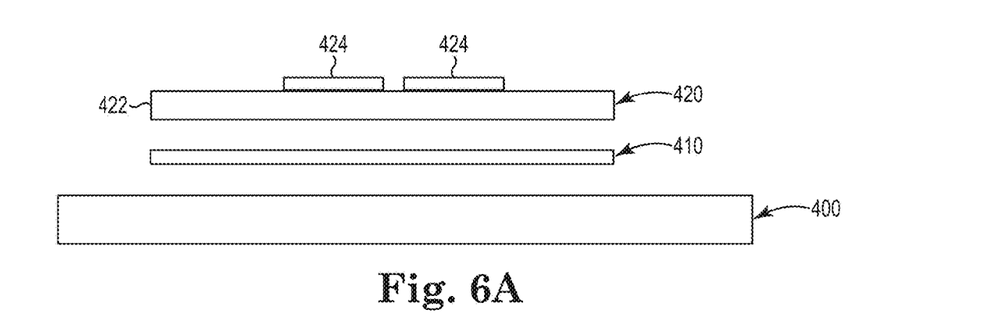
FIG. 6A illustrates an exploded side view one example of a system board, a connector board, and a transceiver module.
Figure 6B:
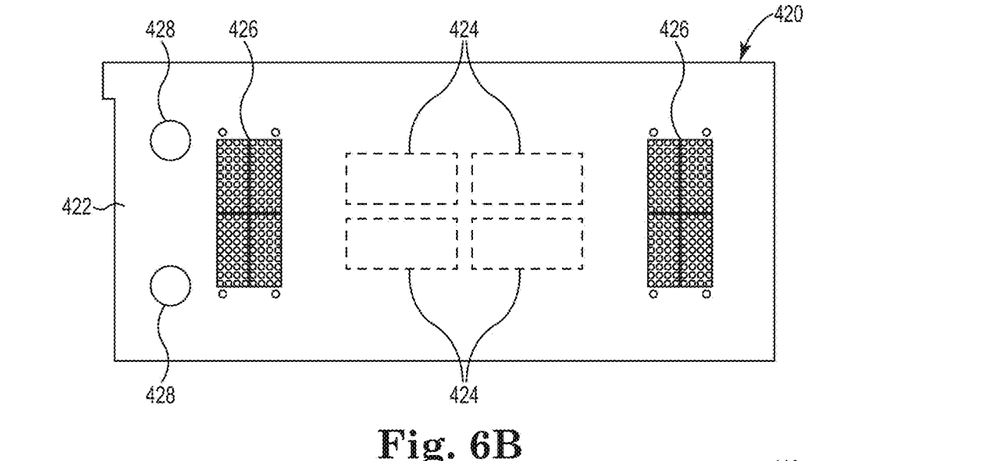
FIG. 6B illustrates a bottom view of one example of a transceiver module.
Figure 6C:
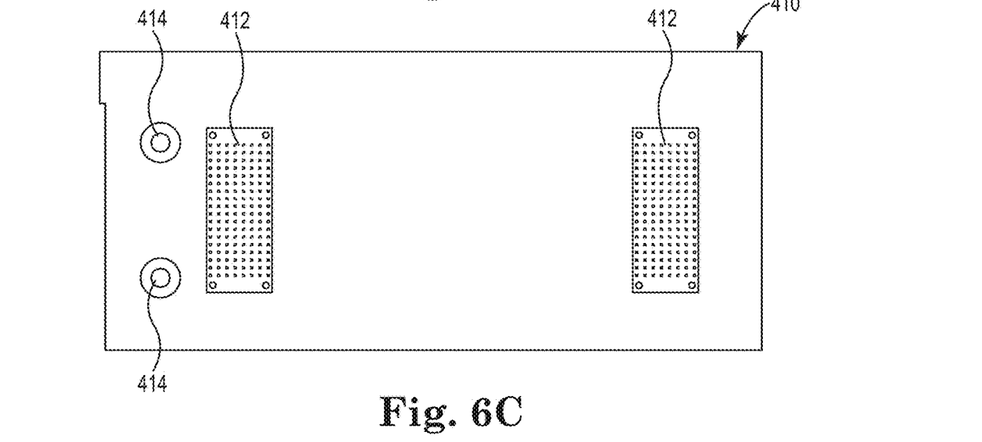
FIG. 6C illustrates a top view of one example of a connector board.

FIG. 6A illustrates an exploded side view of one example of a system board 400, a connector board 410, and a transceiver module 420. FIG. 6B illustrates a bottom view of one example of transceiver module 420. FIG. 6C illustrates a top view of one example of connector board 410. Transceiver module 420 includes a module board 422 (e.g., PCB), transceivers 424 electrically coupled to the top surface of module board 422, and other components (not shown). As illustrated in FIG. 6B, the bottom surface of module board 422 includes contacts 426 for electrically coupling transceiver module 420 to system board 400. In this example, contacts 426 of module board 422 may be electrically coupled to system board 400 via connector board 410. In other examples, contacts 426 of module board 422 may be directly electrically coupled to system board 400 and connector board 410 may be excluded.

Connector board 410 includes contacts on the top surface and on the bottom surface of the connector board to electrically couple module board 422 to system board 400. As illustrated in FIG. 6C, contacts 412 of connector board 410 correspond to contacts 426 of module board 422. In one example, contacts 412 are spring contacts to enable transceiver module 410 to be modularly coupled to connector board 410. In one example, the contacts (not shown) on the bottom surface of connector board 410 may be spring contacts to enable connector board 410 to be modularly coupled to system board 400. In other examples, the contacts on the bottom surface of connector board 410 may be solder balls for fixedly coupling connector board 410 to system board 400. Module board 422 may include alignment and/or retention mechanisms 428. Connector board 410 may include alignment and/or retention mechanisms 414 for engaging corresponding alignment and/or retention mechanisms 428 of module board 422 when transceiver module 420 is installed on system board 400.

The example modularly configurable switch modules described herein enable a higher faceplate connector density than typical 1 U and 2 U switch modules. Mid-board optical transceiver modules with high-density passive optical connectors may be used for high switch port density, without modifying the switch module system board. In addition, one type of transceiver module may be used for uplink ports while another type of transceiver module may be used for downlink ports. A switch module may have different ratios of uplink port transceiver modules and downlink port transceiver modules by using the same switch module system board. The modularly configurable switch modules do not use an internal midplane or large and bulky right-angle blindmate connectors. By not using an internal midplane and bulky connectors, the thermal environment of the modularly configurable switch modules is also improved. Further, the expense and time for producing switch modules of various configurations is reduced by enabling the modular assembly of different switch modules using the same switch module system board, which may be used for 1 U, 2 U or other switch modules. The same transceiver module board may also be used in transceiver modules having different faceplates.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A system comprising:
a printed circuit board comprising a switch chip footprint including first contacts and second contacts, the switch chip footprint to receive a first switch chip having a first number of contacts or a second switch chip having a second number of contacts greater than the first number, the contacts of the first switch chip to electrically couple to the first contacts, and the contacts of the second switch chip to electrically couple to the first contacts and the second contacts;
wherein the printed circuit board comprises a plurality of transceiver module footprints, each transceiver module footprint including third contacts and fourth contacts, each transceiver module footprint to receive a first transceiver module having a third number of contacts or a second transceiver module having a fourth number of contacts greater than the third number, the contacts of the first transceiver module to electrically couple to the third contacts, and the contacts of the second transceiver module to electrically couple to the third contacts and the fourth contacts;
wherein the third contacts of each transceiver module footprint are electrically coupled to the first contacts of the switch chip footprint; and
wherein the fourth contacts of each transceiver module footprint are electrically coupled to the second contacts of the switch chip footprint.

2. The system of claim 1, wherein the switch chip footprint includes fifth contacts, the switch chip footprint to receive the first switch chip, the second switch chip, or a third switch chip having a fifth number of contacts greater than the second number, the contacts of the third switch chip to electrically couple to the first contacts, the second contacts, and the fifth contacts;
wherein each transceiver module footprint includes sixth contacts, each transceiver module footprint to receive the first transceiver module, the second transceiver module, or a third transceiver module having a sixth number of contacts greater than the fourth number, the contacts of the third transceiver module to electrically couple to the third contacts, the fourth contacts, and the sixth contacts;
wherein the sixth contacts of each transceiver module footprint are electrically coupled to the fifth contacts of the switch chip footprint.

3. The system of claim 1, further comprising:
a first switch chip electrically coupled to the first contacts and not to the second contacts.

4. The system of claim 1, wherein the first contacts of the switch chip footprint support a first plurality of lanes and the second contacts of the switch chip footprint support a second plurality of lanes.

5. The system of claim 1, wherein the third contacts of each transceiver module footprint support a first plurality of lanes and the fourth contacts of each transceiver module footprint support a second plurality of lanes.

6. The system of claim 1, further comprising:
a connector board to electrically couple a first transceiver module or a second transceiver module to a transceiver module footprint.

7. A system comprising:
a printed circuit board comprising a switch chip footprint including a first zone, a second zone, a third zone, and a fourth zone, the switch chip footprint to receive a first switch chip corresponding to the first zone, a second switch chip corresponding to the first and second zones, a third switch chip corresponding to the first, second, and third zones, or a fourth switch chip corresponding to the first, second, third, and fourth zones;
wherein the printed circuit board comprises a plurality of transceiver module footprints, each transceiver module footprint comprising a fifth zone electrically coupled to the first zone, a sixth zone electrically coupled to the second zone, a seventh zone electrically coupled to the third zone, and a eighth zone electrically coupled to the fourth zone; and
wherein each transceiver module footprint is to receive a first transceiver module corresponding to the fifth zone, a second transceiver module corresponding to the fifth and sixth zones, a third transceiver module corresponding to the fifth, sixth, and seventh zones, or a fourth transceiver module corresponding to the fifth, sixth, seventh, and eighth zones.

8. The system claim 7, wherein the first switch chip, the second switch chip, the third switch chip, and the fourth switch chip each have a same length and a same width in a direction parallel to the printed circuit board.

9. The system claim 7, wherein the first switch chip, the second switch chip, the third switch chip, and the fourth switch chip each have a different length and a different width in a direction parallel to the printed circuit board.

10. A modularly configurable switch module comprising:
a printed circuit board comprising a switch chip footprint to receive a higher lane count switch chip or a lower lane count switch chip, the printed circuit board comprising a plurality of transceiver module footprints, each transceiver module footprint electrically coupled to the switch chip footprint, and each transceiver module footprint to receive a higher lane count transceiver module or a lower lane count transceiver module;
a switch chip electrically coupled to the switch chip footprint; and
a plurality of transceiver modules, each transceiver module electrically coupled to a transceiver module footprint, wherein at least one of the plurality of transceiver modules is electrically coupled to two transceiver module footprints.

11. The modularly configurable switch module of claim 10, wherein a number of the plurality of transceiver modules are uplink modules and a remaining number of the plurality of transceiver modules are downlink modules to define a downlink-to-uplink ratio for the switch module.

12. The modularly configurable switch module of claim 10, wherein the printed circuit board can be used in a 1 U housing where each of the plurality of transceiver modules have a faceplate to fit the 1 U housing or in a 2 U housing where each of the plurality of transceiver modules have a faceplate to fit the 2 U housing.

13. The modularly configurable switch module of claim 10, wherein each of the plurality of transceiver modules includes a transceiver module board, and
wherein at least one of the transceiver module boards can be used with different optical connectors and different faceplates.

14. The modularly configurable switch module of claim 10, wherein each of the plurality of transceiver modules includes a transceiver module board, and
wherein at least one of the transceiver module boards can be used with pluggable transceiver cages or mid-board optics transceivers.

* * * * *